United States Patent [19]

Garakani et al.

[11] Patent Number: 5,532,739

[45] Date of Patent: Jul. 2, 1996

[54] AUTOMATED OPTICAL INSPECTION APPARATUS

[75] Inventors: Arman M. Garakani, Cambridge; Juha Koljonen, Needham, both of Mass.

[73] Assignee: Cognex Corporation, Natick, Mass.

[21] Appl. No.: 389,437

[22] Filed: Feb. 15, 1995

Related U.S. Application Data

[63] Continuation of Ser. No. 132,532, Oct. 6, 1993, abandoned.

[51] Int. Cl.$^6$ ........................................ H04N 7/18
[52] U.S. Cl. .............................. 348/87; 382/150
[58] Field of Search .................. 348/87, 90, 92, 348/94, 95; 382/145, 146, 147, 149, 150

[56] References Cited

U.S. PATENT DOCUMENTS

| | | | |
|---|---|---|---|
| 4,240,750 | 12/1980 | Kurtz | 356/394 |
| 4,253,111 | 2/1981 | Funk | 348/87 |
| 4,347,964 | 9/1982 | Takasugi | 228/4.5 |
| 4,421,410 | 12/1983 | Karasaki | 356/378 |
| 4,439,010 | 3/1984 | Doty | 359/630 |
| 4,441,248 | 4/1984 | Sherman | 437/8 |
| 4,799,175 | 1/1989 | Sano | 364/552 |
| 4,823,394 | 4/1989 | Berkin | 348/87 |
| 4,855,928 | 8/1989 | Yamanaka | 364/489 |
| 4,899,921 | 2/1990 | Bendat | 348/87 |
| 5,138,180 | 8/1992 | Yamanaka | 250/559.07 |
| 5,156,319 | 10/1992 | Shibasaka | 228/9 |
| 5,170,062 | 10/1992 | Miyahara | 250/559.07 |
| 5,225,891 | 7/1993 | Choumei | 356/376 |

*Primary Examiner*—Howard W. Britton
*Attorney, Agent, or Firm*—Maureen Stretch

[57] ABSTRACT

This invention provides a method and apparatus for automatically locating the bond of a wire to a lead flame and semiconductor chip or similar device as an in-process operation to facilitate in-process inspection. The apparatus includes a wire bonding machine, or similar apparatus, having a movable platform such as an X-Y table for holding semiconductor chips situated in lead frames; a video camera or other optical sensing or imaging device for generating images, which camera is typically positioned over the target chip and lead flame to be bonded; illumination means for illuminating the chip in a lead flame; an image processor capable of digitizing and analyzing the optically sensed images; a bonding mechanism; and a host controller connected to the bonding mechanism, the movable platform, the camera and the image processor. The apparatus generates and stores a pre-bond digital image of the semiconductor chip in the lead flame before bonding has occurred; connects one or more wires between the chip and lead frame by any of a number of means such as ultrasonic bonding, heat bonding, conductive glue bonding or other means; generates and stores a post-bond digital image of the now-bonded chip in its lead frame; registers the pre-bond and post-bond stored digital images so that analysis can be done; and permits inspection of the results of the wire bonds according to appropriate criteria.

14 Claims, 6 Drawing Sheets

AUTOMATED OPTICAL INSPECTION APPARATUS

This is a continuation of application(s) Ser. No. 08/132,532 filed on Oct. 6, 1993, now abandoned.

BACKGROUND OF THE INVENTION

The present invention relates generally to semiconductor chip wire bonding devices, and similar bonding apparatus, and particularly to a method and apparatus for locating a bond in order to perform automated in-process optical inspection of wire bonding in such a device.

Semiconductor devices, such as integrated circuit chips, are electrically connected to leads on a lead frame by a process known as wire bonding. The wire bonding operation involves bonding a wire to electrically connect pads residing on a die (semiconductor chip) to a lead in a lead frame. Once the chip and lead frame have been wire bonded, they can be packaged in ceramic or plastic to form an integrated circuit device. A post-process inspection step, commonly called the third optical inspection, typically involves locating the position of all bonds on the device, the wire connections and the wire heights using optical means.

Heretofore the third optical inspection has been accomplished only after the device is completely bonded and sent to a separate machine or operator. In the majority of cases, the inspection is done by a human operator using a microscope. This manual method can be time-consuming and costly.

Separate machines are available to perform this step, but this requires another piece of capital equipment in the production line. Additionally, a post-process inspection machine has a more difficult time locating the bond to perform a successful inspection because all the information about the chip that was available during the bonding operation, such as exact pad and frame positions and information about other detail have been lost.

This is further complicated by the fact that most semiconductor chips have a considerable amount of visual detail (such as the images of the circuits themselves) which must be circumvented in analyzing the post-bond image to find the bonds. In post-process inspections, some of this detail can be mistaken for parts of the bonds.

Leads on the lead frame are highly specular. Their specularity further complicates a post process visual inspection, as lighting conditions may be significantly different in a post-process inspection, thus causing differences in the appearance and images of the highly specular leads.

Given this visual complexity, attempting to find the bonds without the pre-bond image as a reference makes it much more likely that it will be difficult to correctly identify the bonds from the surrounding visual detail in a post-process inspection. Frequently, in such situations, the visual detail that is unrelated to the bond, may be misinterpreted as part of the bond in a post-process inspection, giving rise to erroneous acceptance or rejection rates.

Visual imperfections on the pads and leads caused by probe marks, discoloration, or imperfect illumination further complicate these difficulties. These blemishes may be misconstrued as defects in the bonding process, without the information that was available during the bonding operation.

An additional problem encountered in attempting to perform the inspection in-process can be created by the differences caused by bonding itself. Depending on the type of bonding process and equipment used, heating, cooling, movement and other mechanical factors can create alignment problems for images taken before and after the bonding process, thus making it harder to locate the bond.

Finally, the pre and post-bond images can also become mis-registered simply as a result of phase differences occurring when the two images are digitized from their respective analog inputs by the image processor.

SUMMARY OF THE INVENTION.

This invention provides a method and apparatus for automatically locating the bond of a wire to a lead frame and semiconductor chip or similar device on one machine as an in-process operation, in order to facilitate in-process inspection. The apparatus includes a wire bonding machine, or similar apparatus, having a movable platform such as an X-Y table for holding semiconductor chips situated in lead frames; a video camera or other optical sensing imaging device for generating images, which camera is typically positioned over the target chip and lead frame to be bonded; illumination means for illuminating the chip in a lead frame; an image processor capable of digitizing and analyzing the video images; a bonding mechanism; and a host controller connected to the bonding mechanism, the movable platform, the camera and the image processor. The apparatus generates and stores a pre-bond digital image of the semiconductor chip in the lead frame before bonding has occurred; connects one or more wires between the chip and lead frame by any of a number of means such as ultrasonic bonding, heat bonding, conductive glue bonding or other means; generates and stores a post-bond digital image of the now-bonded chip in its lead frame; registers the pre-bond and post-bond stored digital images so that analysis can be done; and permits inspection of the results of the wire bonds according to appropriate criteria.

In one embodiment of the invention, registering the pre-bond and post-bond images includes creating subsets of the post-bond digital images as windows for searching in order to register the images.

For example, an optical image sensed by the video camera or other optical sensing device, can be digitized by the image processor and stored in a digital memory as a series of pixels (each pixel being represented by a byte) in a two-dimensional array, having x and y coordinates. A subset, xi, yi of this image which is smaller than the total pre-bond image size, can be generated to be a registration target window. According to one embodiment of the present invention, the image processor stores the location of this pre-bond registration target window, as well as the entire pre-bond image.

Next, bonding occurs, by any of a number of means known in the art, such as ultrasonic bonding, heat bonding, conductive glue, or other bonding methods. Semiconductor devices are typically bonded in such a way as to create an eutectic bond.

After bonding, a post-bond image is created by the image processor and stored in digital memory as another two-dimensional array. A search area is then mapped in the post-bond image, such that the search area is n bytes longer and wider than the pre-bond registration target window area. As can be seen, the search area in the post-bond image should be selected to include the same offset as the post-bond image location that corresponds to the registration target window area, together with a surrounding area large enough to accommodate typical misregistrations or shifts that may occur in the bonding process. Sizes of registration target windows and search areas may vary depending on the size and nature of the device to be bonded.

All possible subsets within the search area in the post-bond image which have dimensions equal to the registration target window are generated to create comparison windows. Registration is accomplished through subtracting the binary pixel values of each of the possible post-bond comparison windows, with origins xf, yf from prebond registration target window, with origin xi yi, found in the search area.

The absolute difference resulting from each image subtraction is summed and stored as a difference metric.

Any of a number of methods of minimization or computing gradient descent well known in the art can then be used to minimize the difference metric to find the comparison window which represents the minimum difference from the registration target window.

In one preferred embodiment, to reduce programming time, a step-wise gradient descent analysis is used. Steepest descent analysis as well as other analyses can be used.

It is also possible to exhaustively search the space to identify every possible misregistration, but that is more costly in time.

It is a further object of the invention that the subtractive image found as a result of registration according to the present invention, represents the bond that has been laid down during the process, since other extraneous details of the pre-bond chip image that match the post-bond chip image have been subtracted out. That is, circuits, as well as visual blemishes and imperfections such as discolorations or probe marks that are unrelated to the bonding process are subtracted out, if they occur in both pre-bond and post-bond images.

This image of the bond, in turn, can then be compared against inspection criteria appropriately specified. As will be obvious to those skilled in the art, inspection criteria will vary depending on the nature of the process and the semiconductor chip devices involved. According to the criteria specified, the bond can be compared to them and a signal generated which will cause eventual acceptance or rejection of the bond. Any of a number of steps can be taken once it is known that bonds are defective. Either the bonding process can be halted, or devices rejected, or operation of the bonding process can be temporarily halted.

In one embodiment of the invention five aspects of each bond are inspected: size of the bond on the chip pad, position of the bond on the chip pad; position of the wire between the chip pad and the lead on the lead frame; size and position of the bond on the lead on the lead frame.

It is an still another object of the present invention to combine the wire bonding locating and optical inspection processes into one automated apparatus and method which is capable of detecting defective chips. Such an automated device is essentially capable of inspecting its own work and thus preventing the propagation of errors. If the machine detects a defective bond on a chip, immediately after the bond has been made, the machine can be prevented from replicating the error. Catching and correcting errors as early and quickly in the process as possible can save valuable chips from being wasted.

DETAILED DESCRIPTION OF THE INVENTION

Figure 1:
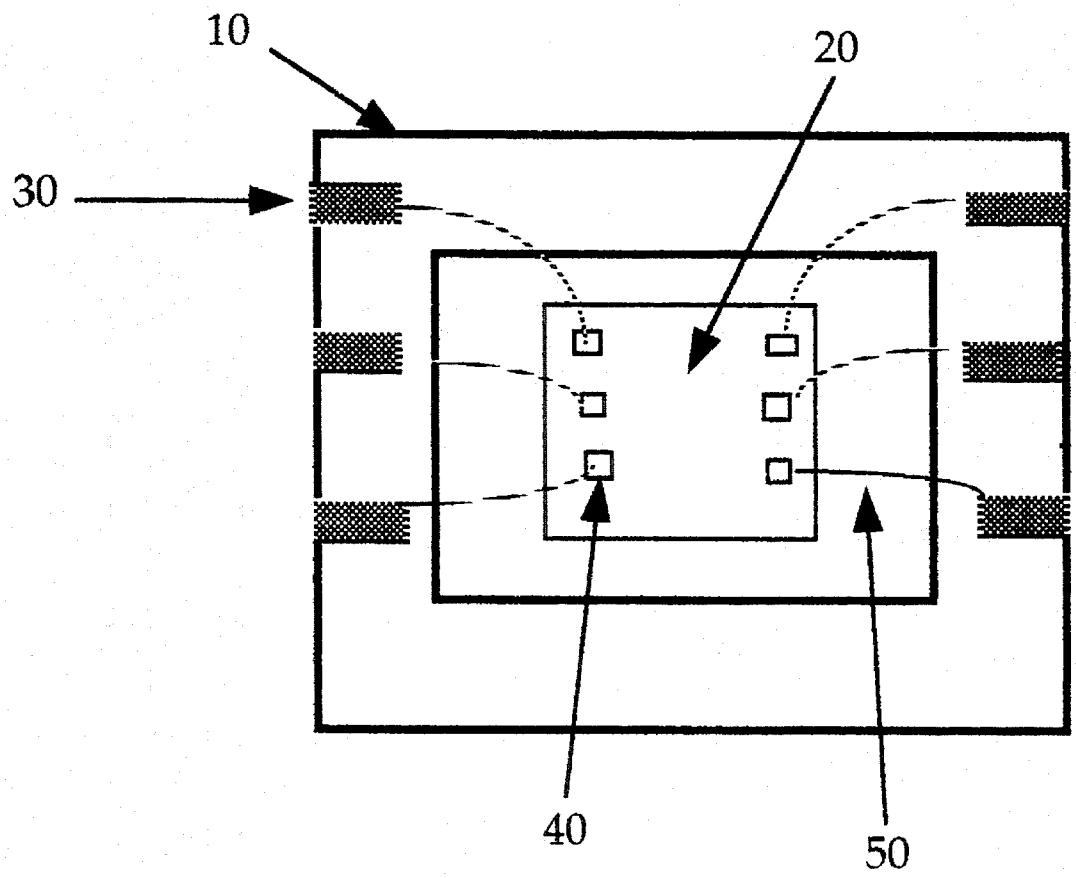
FIG. 1 is a plan view showing a semiconductor chip or die situated in a lead frame, after bonding has occurred. The chip has a number of pads which are connected by wires to the leads shown on the lead frame.

FIG. 1 is a plan view of a semiconductor chip device, (20) of a type which the present invention is designed to inspect. The chip (20) is situated in supporting member which is a lead frame (10). The chip (20) has a number of pads (40) which are connected by wires (50) to the leads (30) on the lead frame (10). While a chip (20) is the subject of the bond being applied, it will be obvious that other devices which are joined to a substrate or a supporting member by a bond which can be optically sensed could be inspected according to the current invention.

Figure 2:
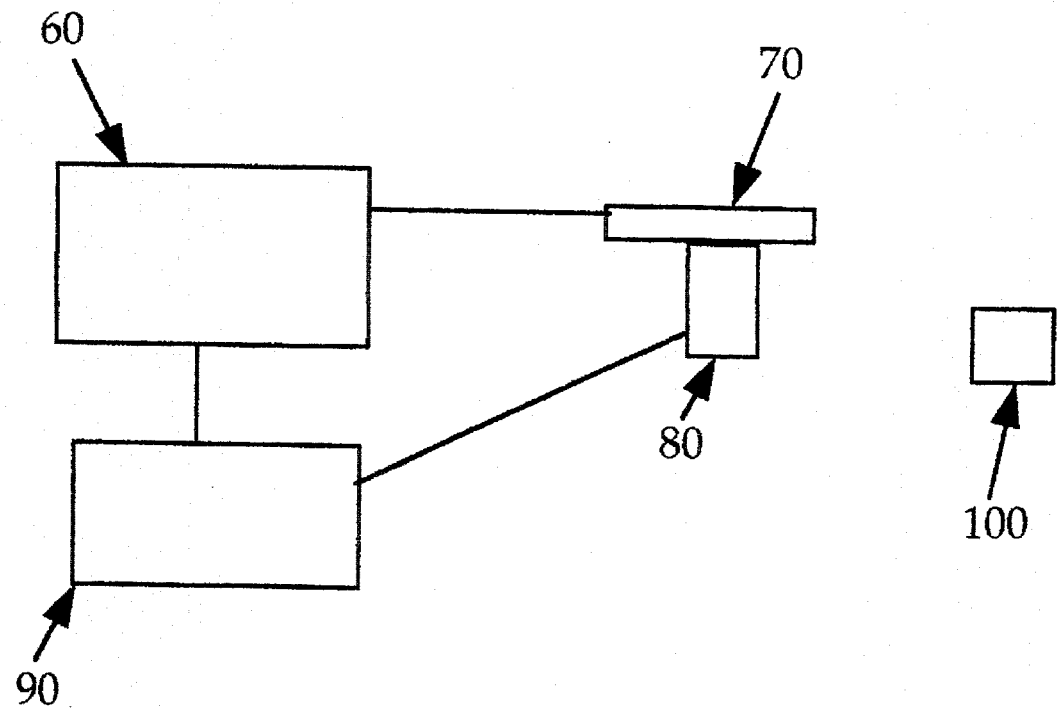
FIG. 2 is a block diagram showing an embodiment of the automated optical inspection apparatus according to the present invention.

FIG. 2 is a block diagram showing an embodiment of the automated optical inspection apparatus according to the present invention. The system for bonding and inspecting a semiconductor device includes an X-Y platform (22) which holds a chip of the kind shown in FIG. 1. Any of a number of methods of moving the devices to be bonded past the bonding apparatus and the optical sensing apparatus can be used.

In a preferred embodiment, the system further includes a video camera (23) positioned over the X-Y platform (22). Video camera (23) is electronically connected to the image processing and analysis system (24). A number of optical sensing devices can be used to capture pre and post bond images of the devices to be bonded. Image processing and analysis system (24) is electronically connected to the Bonder Host Controller (21), which may be any of a number of types of automated bonding device controllers known in the art. Illumination for video camera (23) is typically provided by one or more lights (25) or other illumination means such as reflectors, etc., positioned to illuminate a lead frame and chip placed on the X-Y platform.

Figure 2A:
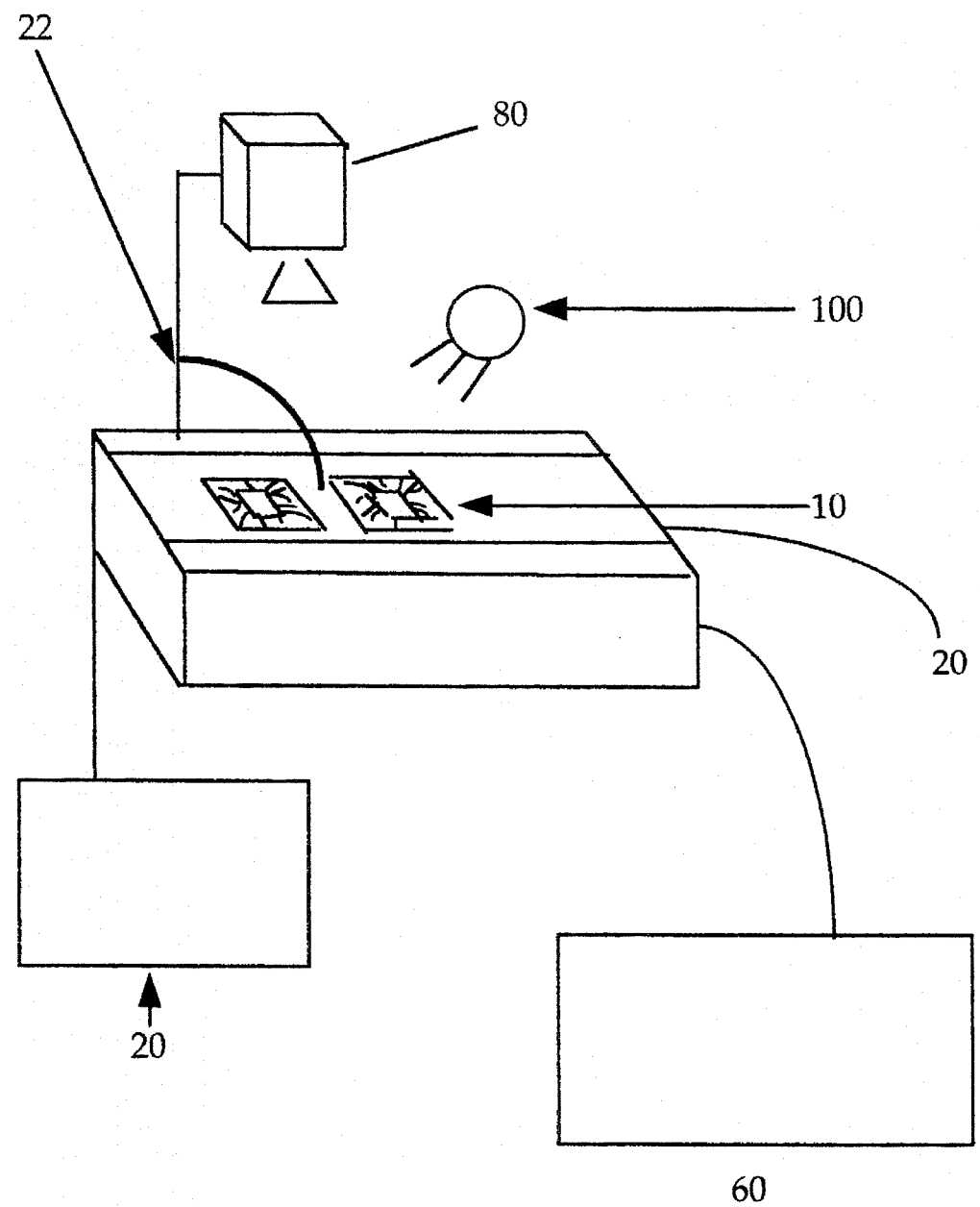
FIG. 2a is another view of a block diagram showing an embodiment of the automated optical inspection apparatus according to the present invention.

FIG. 2a shows a more representational view of an embodiment of the invention, with chips in lead frames (10) positioned on a movable x-y platform, 70, which is controlled by a Bonder Host Controller (60). Video camera (80) is positioned over the x-y platform 70, in such a way as to be able to optically sense images of chips in lead frames (10) and convey those images to Image processing and analysis system (90). A bond means (22), which can be any of a number of bonding mechanisms, is indicated.

Image processing and analysis system (90) in a preferred embodiment, represents a digital data processing system including an image digitizer, a frame grabber, a random access memory, a CPU, and an input/output processor. The image digitizer converts, in a conventional way well known to those skilled in the art, a video image signal into a digital representation of the image seen by the camera. The digital image consists of individual pixels of various light intensifies, having x and y integer coordinates. The pixels represent the elements of the video image, as for example, the pre-bond image. Image processing can be performed in a general purpose computer with image storage capabilities, analog to digital converters and image processing and analysis software or by a dedicated machine vision processing system.

Figure 3:
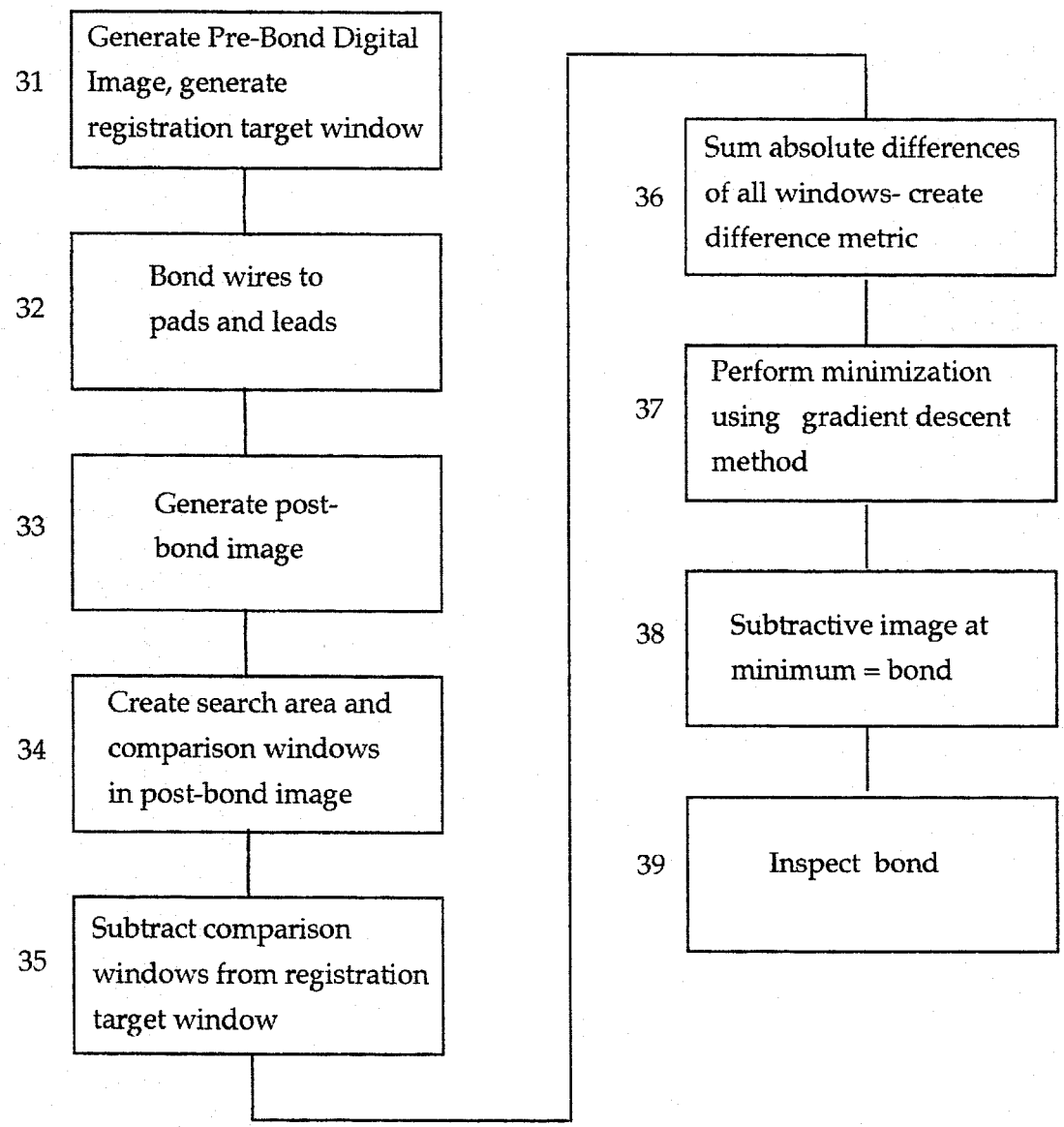
FIG. 3 is a flow diagram illustrating the operational steps of the automated optical inspection apparatus according to the present invention.
Figure 4:
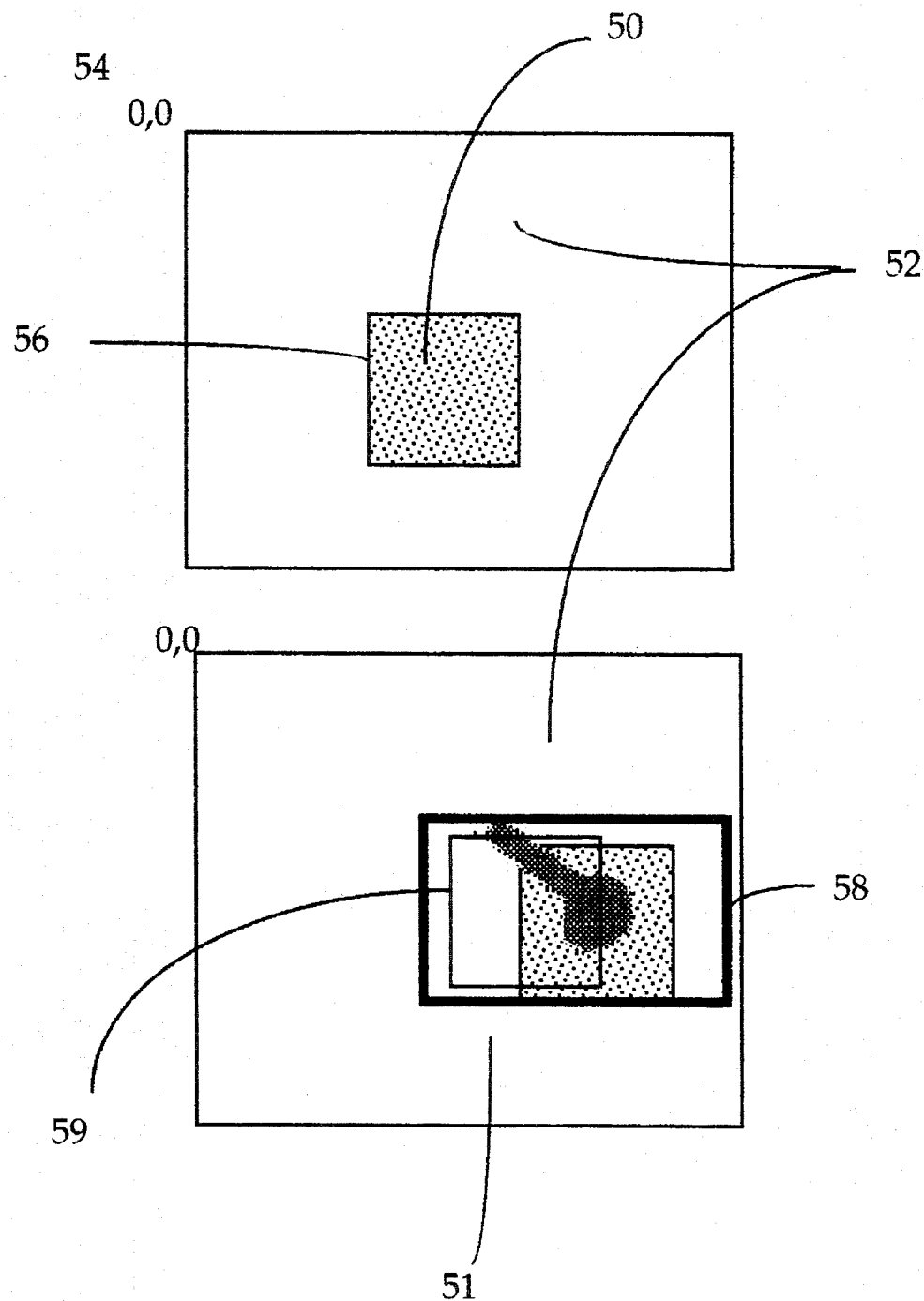
FIG. 4 is a conceptual explanatory view showing the pre-bond, post-bond and subtractive images generated according to the present invention.

Referring now to FIG. 3, the present invention generates a pre-bond digital image from an optically sensed view of the device to be bonded and stores it; this step also includes generation of a registration target window within the pre-bond image (31). Wire bonding is activated and the apparatus bonds wires to lead pads on a chip and to leads on a lead frame (32). Next, the present invention generates and stores a post-bond image (33). In the next step (34), the invention creates a search area within the post-bond image and generates all possible comparison windows within this search area which are equal to the size of the registration target window. Next, (35) each of these comparison windows in the post-bond image is subtracted from the registration target window in the pre-bond image. At each subtraction, the sum of the absolute difference between the two windows is taken and stored as a difference metric (36). Thus, if there are 10 comparison windows subtracted from the registration target window, ten difference metrics will be created. Any of a number of methods of gradient descent analysis can be used to find the minimum difference (37). The subtractive image (38) represented by this minimum can be seen to be an image of the bond itself, without other details of the chip. Once the bond image is available, inspection can be performed on it (39).

Figure 5:
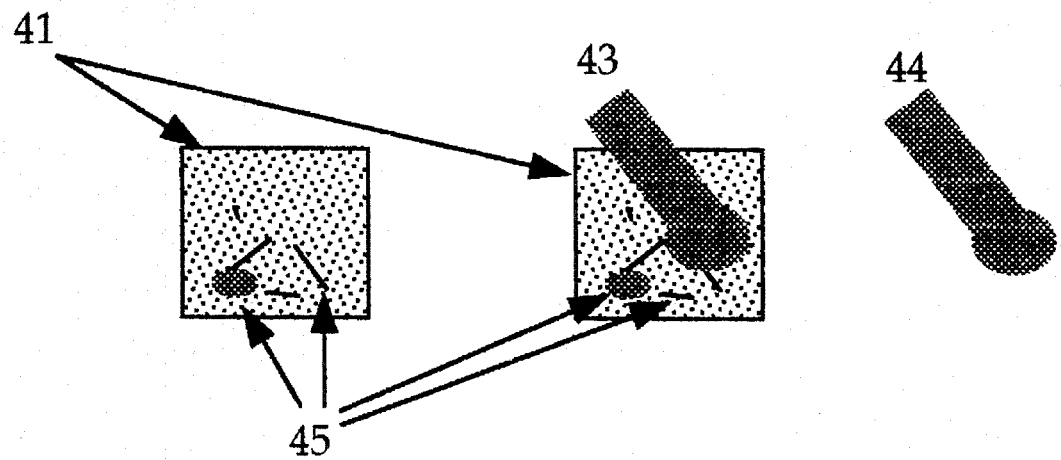
FIG. 5 is a conceptual explanatory view showing windows within the pre-bond and post-bond images generated according to the present invention.

Turning now to FIG. 5, it can be seen that the stored digital pre-bond image (50), is represented as a two-dimensional array in memory, having logical origin 0,0 (54) corresponding to addressable areas of memory. The image analyzer constructs subsets of this array, called windows (52). Typically, a window (52), will have a different origin which is offset some number of bytes from the main image origin (54). In a preferred embodiment of the invention, a registration target window (56) is generated in the pre-bond image as a two-dimensional array which is a subset of the Pre-bond Image (50). Its size and location can be stored along with the rest of the Pre-bond Image (50).

After the bonding process has occurred, a Post-Bond Image (51) is generated. Within this image, a search area (58), is created by the present invention. The search area is selected to be larger in size than the registration target window(56) in the pre-bond image (50). As can be seen, the search area will be a two-dimensional array in memory which is a subset of the two-dimensional array representing the Post-Bond image (51).

Within the Search Area (58), a preferred embodiment of the invention generates all possible subsets of the Search Area (58) which are equal in size to the registration target window (56). These subsets are called comparison windows (59).

It is an aspect of the present invention that each of the Comparison windows (59) is subtracted from the registration target window (56). Each byte in a window contains a binary value representing pixel intensity as described above. The subtraction of a comparison window(59) array of binary pixel values from a registration target window (56) array of binary pixel values will yield an array which is the absolute difference between the two. The elements of this subtractive array are summed and stored as a difference metric, M, for this comparison.

When all of the comparison windows (59) created from the post-bond image have been subtracted from the registration target window (56) in the pre-bond image (50), n difference metrics M exist, where n equals the number of comparison windows(59). The difference metrics M are minimized using any of a number of variants of gradient descent analysis. In one embodiment, a step-wise method of minimization is used, to conserves programming time. However, a number of methods, such as steepest descent analysis can be used to find the minimum.

When the minimum has been found, the subtractive image corresponding to it represents the bond laid down by the bonding process. Referring to FIG. 5, this is illustrated by showing pre and post bond views of a pad (41). Note that pad (41) may contain visual detail from circuits (shown as shaded fill), as well as blemishes (45) which can be the result of discolorations or probe marks or similar imperfections.

Still in FIG. 6, it can be seen that Bonding Point 43, when viewed in conjunction with this noisy background, may be misinterpreted as being defective without the use of the present invention, when, in fact, these "defects" are simply background visual noise. Without the present invention, a post-bond inspection process may fail to locate the Bonding Point (43) completely, as a result of the visual noise.

According to the present invention, when the pre and post bond images have been registered, the Subtractive Image 44 which is generated by the registration process, is also an image of the bond itself, without the background noise known to be in the pre-bond image. Those blemishes and visual details that are common to both the pre and post bond images have been subtracted out.

This result can then be inspected by the image processing system according to any number of inspection criteria which might be applied. Inspection, in turn, can cause chips to be rejected or the process to be halted or delayed, thus reducing the loss of chips and lead frames as a result of poor bonding.

In one embodiment of the invention, five aspects of each bond are inspected: size of the bond on the chip pad, position of the bond on the chip pad; position of the wire between the chip pad and the lead on the lead frame; size and position of the bond on the lead on the lead frame.

The embodiments described above can be used to automate in-process optical inspection of the wire bonding of a semiconductor chip, but other in-process inspections of machine-connected devices which include the use of a bond that can be optically sensed may also be done according to the present invention. Further additions, modifications and substitutes for portions of the illustrated embodiments described above will occur to those skilled in the art and are considered to be within the scope of the invention, as set forth in the following claims.

What is claimed is:

1. A machine vision apparatus for automating in-process inspection of device bonding, comprising:

an image processing means for generating digital image signals corresponding to an optically sensed pre-bond view of a device which is to be bonded to a supporting member, a bonding means, coupled to said image processing means, for placing a bond between said device and said supporting member, a means for activating said image processing means, coupled to said bonding means and said image processing means, for generating digital image signals corresponding to a an optically sensed post-bond view of said device located in said supporting member, a registration means, coupled to said activating means, for subtracting said post-bond view from said pre-bond view to identify a bond, and an inspection means, coupled to said registration means, for verifying said bond.

2. The apparatus of claim 1, wherein said image processing means further comprises an image subset generating means.

3. The apparatus of claim 2, wherein said registration means further comprises:

a means for subtracting subsets of said post-bond view from a subset of said pre-bond view to generate an absolute difference value, a means for summing said absolute difference values, coupled to said subset subtracting means, whereby each sum is stored as a difference metric, and a means for analyzing said difference metrics, coupled to said summing means, to find the difference metric representing the minimum difference.

4. The apparatus of claim 2, wherein said image subset generation means further comprises:

a means for creating at least one registration target window in said pre-bond view, a means for creating a search area within said post-bond view, coupled to said registration target window means, wherein said search area is at least as large as the area of the registration target window in said pre-bond view, and a means for generating a plurality of comparison windows within said search area in said post-bond view, coupled to said search area creation means, wherein said comparison windows have dimensions equal to said registration target window in said pre-bond view.

5. The apparatus of claim 4, wherein said means for generating a plurality of comparison windows includes a means for generating all possible image subsets having dimensions equal to said registration target window.

6. A machine vision apparatus for automating in-process inspection of device bonding, comprising:

an image processing means for generating digital image signals from optically sensing apparatus, a bonding means, coupled to said image processing means, for placing a bond between said device and said supporting member, a means for activating said image processing means, coupled to said bonding means and said image processing means, for generating digital image signals corresponding to an optically sensed pre-bond view and an optically sensed post-bond view of said device located in said supporting member, wherein said image processing means further includes a means for creating a registration target window in said pre-bond view, and a means for creating a search area within said post-bond view, wherein said search area is at least as large as the area of the registration target window in said pre-bond view, together with a means for generating a plurality of comparison windows within said search area in said post-bond view, coupled to said search area creation means, wherein said comparison windows have dimensions equal to said registration target window in said pre-bond view, and a registration means, coupled to said activating means, for subtracting said post-bond view from said pre-bond view to identify a bond by generating an absolute difference value, said registration means further including a means for summing said absolute difference values, whereby each sum is stored as a difference metric, and a means for analyzing said difference metrics, coupled to said summing means, to find the difference metric representing the minimum difference, and an inspection means, coupled to said registration means, for verifying said bond.

7. A method for automating in-process inspection of device bonding, comprising:

generating digital image signals corresponding to an optically sensed pre-bond view of a device which is to be bonded to a supporting member, placing a bond between said device and said supporting member, generating digital image signals corresponding to an optically sensed post-bond view of said device located in said supporting member, registering digital image signals corresponding to a bond by subtracting said post-bond view from said pre-bond view, and inspecting said bond.

8. The method of claim 7 wherein registering further comprises generating an image subset.

9. The method of claim 8, wherein registering further comprises the steps of:

subtracting subsets of said post-bond view from a subset of said pre-bond view to generate an absolute difference value;

summing said absolute difference values, storing each sum as a difference metric, analyzing said difference metrics to find the minimum difference.

10. The method of claim 8, wherein said image subset generation further comprises the steps of:

creating a registration target window in said pre-bond view, creating a search area within said post-bond view, wherein said search area is at least as large as the area of the registration target window in said pre-bond view, and generating a plurality of comparison windows within said search area in said post-bond view, said comparison windows having dimensions equal to said registration target window in said pre-bond view.

11. The method of claim 10, wherein generating a plurality of comparison windows includes the step of generating all possible image subsets having dimensions equal to said registration target window, where said subsets are contained in said search area.

12. A method for automating in-process inspection of device bonding, comprising:

generating digital image signals corresponding to an optically sensed pre-bond view and an optically sensed post-bond view of a device which is to be bonded to a supporting member, placing a bond between said device and said supporting member, generating a subset of said pre-bond view to create a registration target window, generating a subset of said post-bond view to create a search area within said post-bond view, wherein said search area is at least as large as the area of the registration target window in said pre-bond view, and generating all possible image subsets in said search area having dimensions equal to said registration target window to create comparison windows within said search area in said post-bond view, subtracting said comparison windows in said post-bond view from said registration target window in said pre-bond view to generate an absolute difference value;

summing said absolute difference value, storing each sum as a difference metric, analyzing said difference metrics to find the minimum difference, and inspecting the bond.

13. An apparatus for locating a bond made between a device and a supporting member comprising:

an image processor capable of generating and analyzing digital image signals taken from an optical sensing apparatus, a bonding machine, electronically coupled to said image processor, said bonding machine being capable of placing a bond between said device and said supporting member, a host controller electronically coupled to said image processor and to said bonding machine for causing said image processor to generate digital image signals corresponding to an optically sensed pre-bond view and an optically sensed post-bond view of said device located in said supporting member, a computer program residing within said image processor, for performing the steps of:

creating a registration target window in said pre-bond view, and a search area within said post-bond view, wherein said search area is at least as large as the area of the registration target window in said pre-bond view, generating a plurality of comparison windows within said search area in said post-bond view, such that said comparison windows have dimensions equal to said registration target window in said pre-bond view, and subtracting said post-bond comparison windows from said registration target window in said pre-bond view to generate an absolute difference value, summing said absolute difference values to store each sum as a difference metric, and analyzing said difference metrics to find the minimum difference to identify the location of a bond.

14. A method for locating a bond made between a device and a supporting member comprising:

generating and analyzing digital image signals taken from an optical sensing apparatus which can create a pre-bond view of said device and supporting member and a post-bond view of said device and supporting member, placing a bond between said device and said supporting member, creating a registration target window in said pre-bond view, and a search area within said post-bond view, wherein said search area is at least as large as the area of the registration target window in said pre-bond view, generating a plurality of comparison windows within said search area in said post-bond view, such that said comparison windows have dimensions equal to said registration target window in said pre-bond view, and subtracting said post-bond comparison windows from said registration target window in said pre-bond view to generate an absolute difference value, summing said absolute difference values, whereby each sum is stored as a difference metric, and analyzing said difference metrics to find the minimum difference.

* * * * *